United States Patent
Halbritter et al.

(10) Patent No.: US 10,741,993 B2
(45) Date of Patent: Aug. 11, 2020

(54) LASER COMPONENT AND METHOD OF PRODUCING A LASER COMPONENT

(71) Applicant: OSRAM OLED GmbH, Regensburg (DE)

(72) Inventors: Hubert Halbritter, Dietfurt-Toeging (DE); Andreas Wojcik, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/338,559

(22) PCT Filed: Oct. 26, 2017

(86) PCT No.: PCT/EP2017/077466
§ 371 (c)(1),
(2) Date: Apr. 1, 2019

(87) PCT Pub. No.: WO2018/078025
PCT Pub. Date: May 3, 2018

(65) Prior Publication Data
US 2019/0252852 A1    Aug. 15, 2019

(30) Foreign Application Priority Data
Oct. 28, 2016 (DE) .................. 10 2016 120 635

(51) Int. Cl.
*H01S 5/022* (2006.01)
*H01S 5/00* (2006.01)
*G02B 6/42* (2006.01)

(52) U.S. Cl.
CPC ........ *H01S 5/02292* (2013.01); *G02B 6/4214* (2013.01); *H01S 5/0071* (2013.01); *H01S 5/02228* (2013.01); *H01S 5/02244* (2013.01); *H01S 5/02252* (2013.01); *H01S 5/02288* (2013.01); *H01S 5/02296* (2013.01)

(58) Field of Classification Search
CPC ............... H01S 5/02292; H01S 5/0071; H01S 5/02228; H01S 5/02244; H01S 5/02252; H01S 5/02288; H01S 5/02296; G02B 6/4214
See application file for complete search history.

(56) References Cited

U.S. PATENT DOCUMENTS

| | | |
|---|---|---|
| 5,177,753 A | 1/1993 | Tanaka |
| 2005/0226636 A1 | 10/2005 | Hiramatsu |
| 2015/0233534 A1 | 8/2015 | Kaiser |

(Continued)

FOREIGN PATENT DOCUMENTS

| | | |
|---|---|---|
| DE | 102 09 063 C1 | 10/2003 |
| DE | 10 2012 109 131 A1 | 3/2014 |

(Continued)

*Primary Examiner* — Armando Rodriguez
(74) *Attorney, Agent, or Firm* — DLA Piper LLP (US)

(57) ABSTRACT

A laser component including a molded body, and a laser chip embedded into the molded body and configured to emit a laser beam in an emission direction, wherein a surface of the molded body includes a deflection section arranged and inclined relative to the emission direction such that a laser beam emitted by the laser chip impinges on the deflection section and is subjected to total internal reflection at the deflection section.

12 Claims, 3 Drawing Sheets

(56) References Cited

U.S. PATENT DOCUMENTS

| | | | |
|---|---|---|---|
| 2015/0311404 A1* | 10/2015 | Binder | H01L 33/44 257/99 |
| 2015/0331206 A1 | 11/2015 | Dutta | |
| 2017/0097475 A1* | 4/2017 | Shibuya | H01L 31/0232 |
| 2017/0170625 A1 | 6/2017 | Halbritter | |

FOREIGN PATENT DOCUMENTS

| | | |
|---|---|---|
| DE | 10 2015 208 704 A1 | 11/2016 |
| JP | 7-58414 | 3/1995 |
| WO | 2016/005150 A1 | 1/2016 |
| WO | 2016/180851 A1 | 11/2016 |

\* cited by examiner

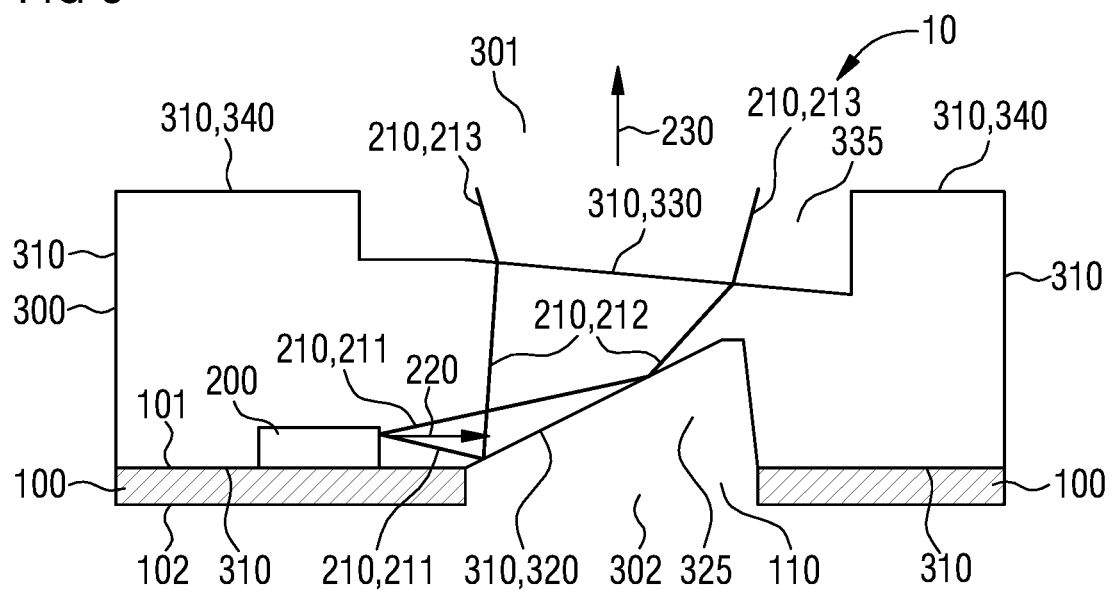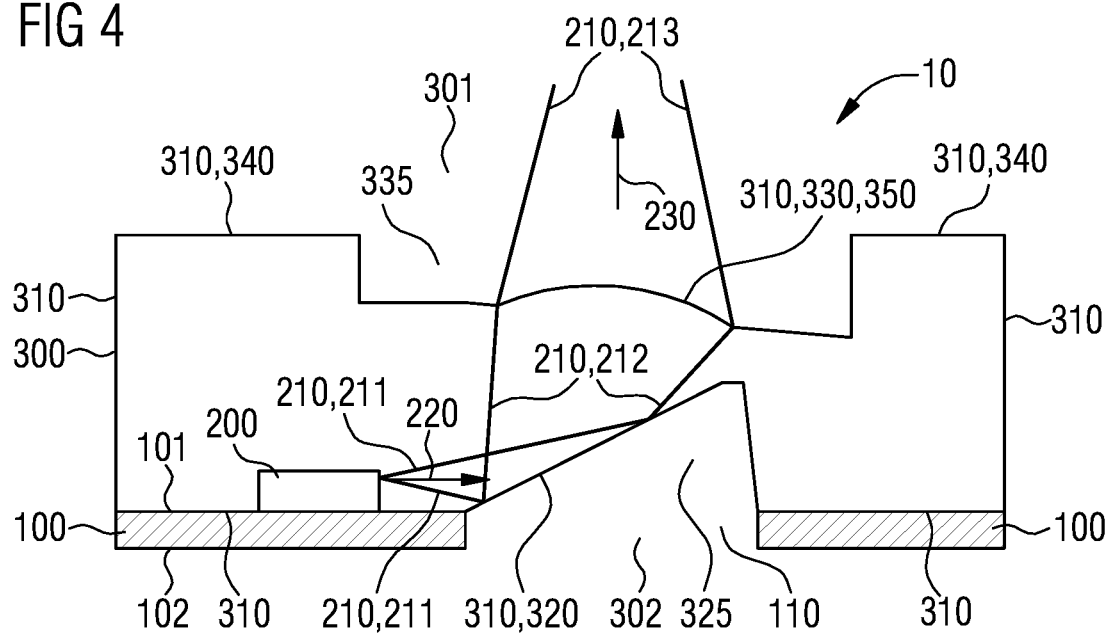

LASER COMPONENT AND METHOD OF
PRODUCING A LASER COMPONENT

TECHNICAL FIELD

This disclosure relates to a laser component and a method of producing a laser component.

BACKGROUND

Laser components comprising semiconductor laser chips are known. It is known to provide in housings of such laser components deflection mirrors that deflect a laser beam emitted by the laser chip.

SUMMARY

We provide a laser component including a molded body, and a laser chip embedded into the molded body and configured to emit a laser beam in an emission direction, wherein a surface of the molded body includes a deflection section arranged and inclined relative to the emission direction such that a laser beam emitted by the laser chip impinges on the deflection section and is subjected to total internal reflection at the deflection section.

We also provide a method of producing a laser component including providing a laser chip configured to emit a laser beam in an emission direction, and forming a molded body, wherein the laser chip is embedded into the molded body, and the molded body is formed with a surface including a deflection section arranged and inclined relative to the emission direction such that a laser beam emitted by the laser chip impinges on the deflection section and is subjected to total internal reflection at the deflection section.

BRIEF DESCRIPTION OF THE DRAWINGS

FIG. 3 schematically shows a sectional side view of a laser component in accordance with a first example.

FIG. 4 schematically shows a sectional side view of a laser component in accordance with a second example FIG. 5 schematically shows a sectional side view of a laser component in accordance with a third example.

LIST OF REFERENCE SIGNS

Figure 1:
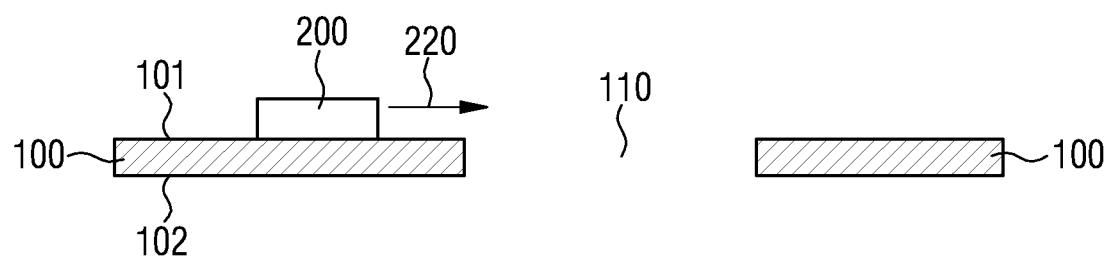
FIG. 1 schematically shows a sectional side view of a carrier and a laser chip arranged thereon.

10 Laser component
100 Carrier
101 Top side
102 Underside
110 Opening
200 Laser chip
210 Laser beam
211 First beam section
212 Second beam section
213 Third beam section
220 Emission direction
230 Radiation direction
300 Molded body
301 Top side
302 Underside
310 Surface
320 Deflection section
325 Lower indentation
330 Emergence section
335 Upper indentation
340 Bearing section
350 Optical lens
360 Roughening
400 Mold tool
410 Lower part
420 Upper part
430 Lower extension
435 Lower extension surface
440 Upper extension
445 Upper extension surface
450 Cavity

DETAILED DESCRIPTION

Our laser component comprises a molded body and a laser chip embedded into the molded body and configured to emit a laser beam in an emission direction. A surface of the molded body comprises a deflection section arranged and inclined relative to the emission direction such that a laser beam emitted by the laser chip impinges on the deflection section and is subjected to total internal reflection at the deflection section.

Advantageously, a deflection of a laser beam emitted by the laser chip of this laser component is obtained, in this laser component, by total internal reflection of the laser beam at the surface of the molded body of the laser component. As a result, a separate deflection mirror is not necessary in the laser component, as a result of which the laser component is advantageously producible simply and cost-effectively from just a small number of individual component parts. A further advantage is that only low absorption and transmission losses occur in the beam deflection of the laser beam emitted by the laser chip by total internal reflection at the deflection section of the surface of the molded body.

The laser component may comprise a carrier. In this example, the laser chip is arranged at a top side of the carrier. The molded body adjoins the top side of the carrier. The carrier of this laser component may advantageously serve for the electrical contacting of the laser chip of the laser component and enable the laser component to be electrically contacted from outside. In addition, the carrier may also bring about a mechanical stabilization of the laser component.

The emission direction may be oriented parallel to the top side of the carrier. In this example, the laser chip of the laser component may be formed, for example, as an edge emitting laser chip. Advantageously, deflection of the laser beam emitted by the laser chip at the deflection section of the molded body of the laser component enables the laser beam to be radiated in a different direction than the emission direction.

The deflection section may be formed at a side of the molded body facing the top side of the carrier. In this example, the carrier comprises an opening in the region of the deflection section. Hence, the deflection section of the surface of the molded body constitutes an interface between the material of the molded body and the medium surrounding the laser component, in particular, for example, an interface between the material of the molded body and air surrounding the molded body of the laser component. Thus, the deflection section of the surface of the molded body constitutes an interface between an optically denser medium and an optically less dense medium at which a total internal reflection of a laser beam emitted by the laser chip is possible.

The surface of the molded body may comprise, at a side of the molded body facing away from the top side of the carrier, a bearing section parallel to the emission direction. The bearing section of the molded body of the laser component may serve, for example, as a support surface for an optical unit of the laser component, for example, as a support surface for an optical lens. Advantageously, the bearing section of the molded body in this example enables a simple alignment of the component part of the laser component that bears on the bearing section.

The surface of the molded body may comprise an emergence section. A laser beam emitted by the laser chip and reflected at the deflection section may emerge from the molded body through the emergence section. This advantageously enables a laser beam emitted by the laser chip of the laser component to be radiated into the surroundings of the laser component. In this example, the radiation direction may differ from the emission direction of the laser chip as a result of deflection of the laser beam at the deflection section of the molded body.

A laser beam emitted by the laser chip and reflected at the deflection section may be refracted at the emergence section in a direction perpendicular to the emission direction. Advantageously, the emergence section of the molded body thereby brings about an additional deflection of a laser beam emitted by the laser chip. Deflection of the laser beam brought about by total internal reflection at the deflection section of the molded body and the deflection of the laser beam brought about by refraction of the laser beam at the emergence section of the molded body in this example deflect the laser beam jointly in a direction oriented perpendicular to the emission direction of the laser chip. This radiation direction may also be oriented perpendicular to the top side of the carrier of the laser component if the laser component comprises a carrier.

The emergence section may constitute an optical lens, in particular a collimation lens. Advantageously, a laser beam emitted by the laser chip of the laser component is thereby shaped by the optical lens constituted of the emergence section during emergence from the molded body. As a result, it is possible to achieve, for example, collimation of the laser beam in the direction of the "fast axis" of the laser chip.

The bearing section may delimit the emergence section. This advantageously enables a particularly simple and accurate alignment of an optical unit bearing on the bearing section relative to the emergence section of the surface of the molded body.

The molded body may comprise a silicone. Advantageously, the molded body thereby comprises a refractive index greater than a refractive index of air. Moreover, the molded body is thereby advantageously resistant to laser radiation generated by the laser chip. A further advantage is that a molded body comprising a silicone may be produced simply and cost-effectively.

A method of producing a laser component comprises steps for providing a laser chip configured to emit a laser beam in an emission direction, and forming a molded body. In this example, the laser chip is embedded into the molded body. The molded body is formed with a surface comprising a deflection section arranged and inclined relative to the emission direction such that a laser beam emitted by the laser chip impinges on the deflection section and is subjected to total internal reflection at the deflection section.

Advantageously, this method enables simple and cost-effective production of a laser component from just a small number of individual component parts. This is made possible, in particular, by the fact that the molded body is formed such that a beam deflection of a laser beam emitted by the laser chip is carried out by total internal reflection at a deflection section of the molded body. As a result, no separate deflection mirror is required in the laser component obtainable by the method.

The molded body may be formed by a molding method in a mold tool, in particular transfer molding or compression molding. In this example, the deflection section is formed at an extension of the mold tool. This advantageously enables simple and cost-effective production of the molded body of the laser component.

The method may comprise further steps of providing a carrier and arranging the laser chip at a top side of the carrier. In this example, the molded body is formed in a manner adjoining the top side of the carrier. In the laser component obtainable by this method, the carrier may serve for the electrical contacting of the laser chip and enable the laser component obtainable by the method to be electrically contacted from outside. Moreover, the carrier may bring about a mechanical stabilization of the component obtainable by the method.

The carrier may be provided with an opening. The extension of the mold tool projects through the opening of the carrier during the process of forming the molded body. This advantageously makes it possible to form the deflection section of the surface of the molded body at the side of the molded body facing the carrier.

The above-described properties, features and advantages and the way in which they are achieved will become clearer and more clearly understood in association with the following description of examples explained in greater detail in association with the drawings.

FIG. 1 shows a schematical sectional side view of a carrier 100 provided to produce a laser component. The carrier 100 may be formed, for example, as a printed circuit board (PCB) or as a metallic leadframe.

The carrier 100 comprises a top side 101 and an underside 102 opposite the top side 101.

If the carrier 100 is formed as a printed circuit board, then electrically conductive contact pads and electrically conductive conductor tracks may each be formed at the top side 101 and at the underside 102. In this example, the carrier 100 may also comprise through contacts extending through the carrier 100 between the top side 101 and the underside 102.

If the carrier 100 is formed as a leadframe, then the carrier 100 may be subdivided into different sections or, in a subsequent processing step, be subdivided into different sections that are electrically insulated from one another and constitute electrical contact pads of the carrier 100. The sections may be arranged laterally next to one another.

The carrier 100 comprises an opening 110 extending through the carrier 100 between the top side 101 and the underside 102 of the carrier 100. The opening 110 of the carrier 100 may comprise, for example, a circular-disk-shaped or a rectangular cross-sectional area. Besides the opening 110, the carrier 100 may comprise further openings.

A laser chip 200 is arranged at the top side 101 of the carrier 100. The laser chip 200 is a semiconductor laser chip comprising an integrated laser diode. The laser chip 200 is configured to emit a laser beam in an emission direction 220. The laser chip 200 may be configured, for example, to emit a laser beam comprising a wavelength from the infrared spectral range. The laser chip 200 may be formed, for example, as an edge emitting laser chip.

The laser chip 200 may be arranged at the top side 101 of the carrier 100 such that the emission direction 220 of the laser chip 200 is oriented parallel to the top side 101 of the carrier 100. However, the emission direction 220 of the laser chip 200 might also be tilted relative to the top side 101 of the carrier 100. The laser chip 200 is arranged at the top side 101 of the carrier 100 such that the emission direction 220 of the laser chip 200 is oriented toward the opening 110 of the carrier 100.

The laser chip 200 is electrically contacted at the top side 101 of the carrier 100. For this purpose, electrical contact regions of the laser chip 200 may connect to electrical contact pads at the top side 101 of the carrier 100, for example, by an electrically conductive adhesive connection, an electrically conductive solder connection or bond wires.

Figure 2:
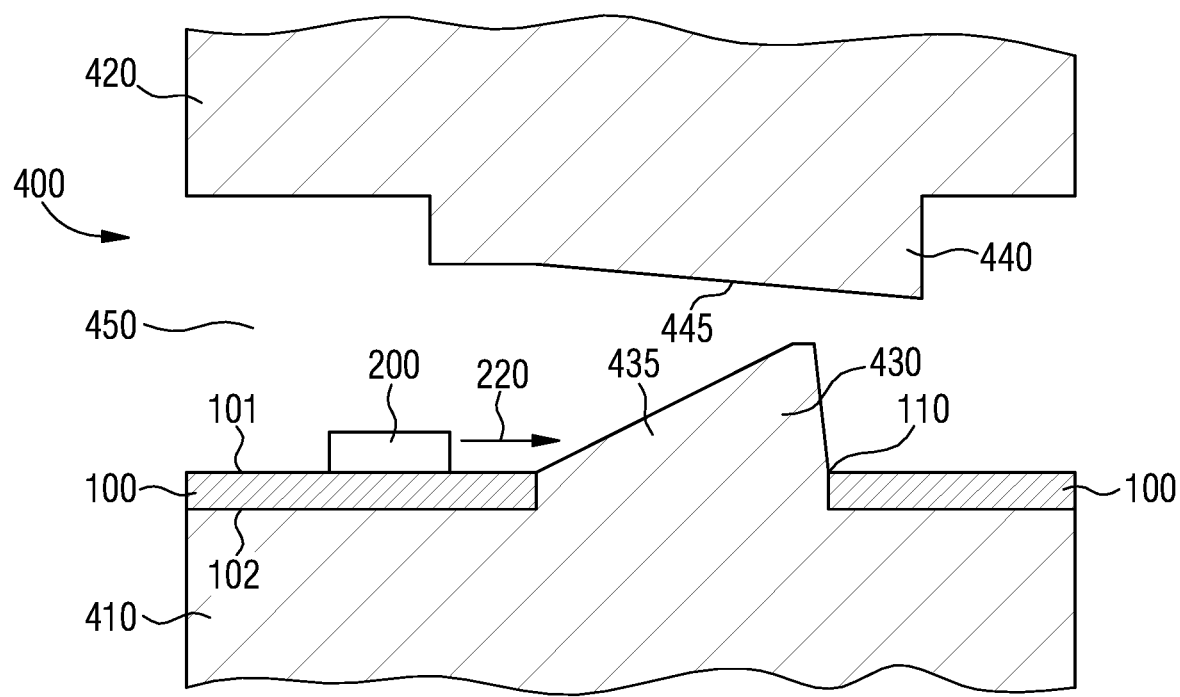
FIG. 2 schematically shows a sectional side view of a mold tool.

FIG. 2 shows a schematic sectional side view of a mold tool 400. The mold tool 400 may also be referred to as a molding tool. The mold tool 400 is provided to carry out a molding method (mold method), for example, carry out a transfer molding method or a compression molding method.

The mold tool 400 comprises a lower part 410 and an upper part 420, which bound a cavity 450 referred to as a mold. The cavity 450 is arranged between the lower part 410 and the upper part 420 of the mold tool 400.

The carrier 100 with the laser chip 200 arranged at the top side 101 of the carrier 100 has been arranged in the cavity 450 of the mold tool 400. The underside 102 of the carrier 100 bears on the lower part 410 of the mold tool 400 such that the top side 101 of the carrier 100 and the laser chip 200 arranged at the top side 101 of the carrier 100 face the remaining cavity 450 and the upper part 420 of the mold tool 400.

The lower part 410 of the mold tool 400 comprises a lower extension 430 projecting into the cavity 450 of the mold tool 400. In this example, the lower extension 430 extends through the opening 110 of the carrier 100.

The lower extension 430 comprises a wedge-shaped configuration comprising a lower extension surface 435 that is planar at least in sections and is arranged in the cavity 450 above the top side 101 of the carrier 100 located in the cavity 450 of the mold tool 400. The lower extension surface 435 of the lower extension 430 is inclined relative to the top side 101 of the carrier 100 and relative to the emission direction 220 of the laser chip 200 arranged in the cavity 450 of the mold tool 400 and faces the laser chip 200.

In the example shown in FIG. 2, the upper part 420 of the mold tool 400 comprises an upper extension 440 projecting into the cavity 450 of the mold tool 400. The upper extension 440 comprises an upper extension surface 445 that is planar at least in sections and is likewise inclined relative to the top side 101 of the carrier 100 arranged in the cavity 450 of the mold tool 400 and relative to the emission direction 220 of the laser chip 200 arranged in the cavity 450. In this example, the upper extension surface 445 is also inclined in the direction toward the laser chip 200. In one simplified example, it is possible to dispense with the inclined upper extension surface 445 of the upper extension 440 or the entire upper extension 440 of the upper part 420 of the mold tool 400.

In a processing step temporally succeeding the illustration in FIG. 2, a molded body 300 is formed in the cavity 450 of the mold tool 400 by a molding method, for example, transfer molding or compression molding. The molded body 300 is formed from a molding material. The molding material may comprise a silicone, for example. The molding material may also comprise an epoxy.

In this example, the molded body 300 is formed in a manner adjoining the carrier 100 arranged in the cavity 450 such that the laser chip 200 arranged at the top side 101 of the carrier 100 is embedded into the molded body 300. In this example, the molded body 300 and the carrier 100 connect to one another.

Afterward, the molded body 300, the carrier 100 and the laser chip 200 arranged at the top side 101 of the carrier 100 and embedded into the molded body 300 are removed from the cavity 450 of the mold tool 400. The carrier 100, the laser chip 200 and the molded body 300 together form a laser component 10. FIG. 3 shows a schematic sectional side view of the laser component 10 after removal from the cavity 450 of the mold tool 400.

The molded body 300 formed in the cavity 450 of the mold tool 400 comprises a shape corresponding to the shape of the cavity 450 of the mold tool 400. The molded body 300 comprises a top side 301 and an underside 302 opposite the top side 301. The top side 301 of the molded body 300 has been formed in a manner bearing against the upper part 420 of the mold tool 400. The underside 302 of the molded body 300 has been formed in sections in a manner bearing against the lower part 410 of the mold tool 400 and in sections in a manner bearing against the top side 101 of the carrier 100 bearing against the lower part 410 of the mold tool 400.

At its top side 301, the molded body 300 comprises an upper indentation 335 that has been formed where the upper extension 440 of the upper part 420 of the mold tool 400 projected into the cavity 450. At its underside 302, the molded body 300 comprises a lower indentation 325 formed where the lower extension 430 of the lower part 410 of the mold tool 400 projected into the cavity 450 of the mold tool 400. The lower indentation 325 is arranged above the opening 110 of the carrier 100.

In the region of the lower indentation 325, a surface 310 of the molded body 300 comprises a deflection section 320 formed in a manner bearing against the lower extension surface 435 of the lower extension 430 of the lower part 410 of the mold tool 400. The deflection section 320 is thus arranged in the region of the lower indentation 325 of the molded body 300 and in the region above the opening 110 of the carrier 100. The deflection section 320 of the surface 310 of the molded body 300 constitutes an interface between the material of the molded body 300 and the medium surrounding the molded body 300, which medium may be air, for example. The deflection section 320 is inclined relative to the top side 101 of the carrier 100 and relative to the emission direction 220 of the laser chip 200.

In the region of the upper indentation 335 at the top side 301 of the molded body 300, the surface 310 of the molded body 300 comprises an emergence section 330. The emergence section 330 of the surface 310 of the molded body 300 has been formed in a manner bearing against the upper extension surface 445 of the upper extension 440 of the upper part 420 of the mold tool 400. The emergence section 330 is inclined relative to the emission direction 220 of the laser chip 200 and relative to the top side 101 of the carrier 100 of the laser component 10.

The underside 302 of the molded body 300 adjoins the top side 101 of the carrier 100. The laser chip 200 is embedded into the molded body 300 at the underside 302 of the molded body 300. The molded body 300 and the carrier 100 connect to one another.

During operation of the laser component 10, the laser chip 200 emits a laser beam 210 in the emission direction 220.

Since the laser chip 200 is embedded into the molded body 300, the laser beam 210 is radiated into the material of the molded body 300 by the laser chip 200. For this purpose, the material of the molded body 300 comprises a sufficient resistance to laser light emitted by the laser chip 200.

A first beam section 211 of the laser beam 210 emitted by the laser chip 200 passes from the laser chip 200 in the emission direction 220 through the molded body 300 and impinges on the deflection section 320 of the surface 310 of the molded body 300. The deflection section 320 is inclined relative to the emission direction 220 of the laser chip 200 such that the laser beam 210 impinging on the deflection section 320 is subjected to total internal reflection at the deflection section 320.

The laser beam 210 subjected to total internal reflection at the deflection section 320 of the surface 310 of the molded body 300 does not leave the molded body 300, but rather passes as second beam section 212, proceeding from the deflection section 320, further through the molded body 300 in the direction toward the top side 301 of the molded body 300. The second beam section 212 of the laser beam 210 is deflected or diverted relative to the first beam section 211 of the laser beam 210. The second beam section 212 may be deflected relative to the first beam section 211, for example, by an angle of 0° to 90°. It is also possible for the second beam section 212 to be deflected relative to the first beam section 211 by an angle of exactly 90° or by an angle of more than 90°.

The second beam section 212 of the laser beam 210 emanating from the deflection section 320 of the surface 310 of the molded body 300 passes through the molded body 300 as far as the emergence section 330 of the surface 310 of the molded body 300 at the top side 301 of the molded body 300. At the emergence section 330 of the surface 310, the laser beam 210 emerges from the molded body 300 of the laser component 10. The laser beam 210 that has emerged from the molded body 300 at the emergence section 330 is radiated in a radiation direction 230 as a third beam section 213 by the laser component 10.

The laser beam 210 is refracted during emergence from the molded body 300 in the emergence section 330 of the surface 310 of the molded body 300 and is deflected as a result. The third beam section 213 of the laser beam 210 is inclined relative to the second beam section 212 of the laser beam 210 as a result. The radiation direction 230 of the third beam section 213 of the laser beam 210 may be oriented, for example, perpendicular to the emission direction 220 of the laser chip 200.

In one simplified example of the laser component 10, the emergence section 330 of the surface 310 of the molded body 300 may be inclined such that the laser beam 210 emerging from the molded body 300 in the emergence section 330 is not refracted and therefore not deflected. For this purpose, the emergence section 330 of the surface 310 of the molded body 300 is oriented perpendicular to the course of the second beam section 212 of the laser beam 210. This may be expedient in particular if the laser beam 210 is deflected in the desired radiation direction 230 by the total internal reflection at the deflection section 320 of the surface 310 of the molded body 300, for example, by an angle of 90° relative to the emission direction 220.

At the top side 301 of the molded body 300, the surface 310 of the molded body 300 comprises a bearing section 340. The bearing section 340 delimits the upper indentation 335 and the emergence section 330 of the molded body 300 in a ring-shaped fashion. In this example, the bearing section 340 of the surface 310 of the molded body 300 is oriented parallel to the top side 101 and to the underside 102 of the carrier 100 of the laser component 10, parallel to the emission direction 220 of the laser chip 200 and perpendicular to the radiation direction 230 of the laser component 10.

The bearing section 340 of the molded body 300 may serve as a support surface for further component parts of the laser component 10, in particular, for example, as a support surface for a further optical component part of the laser component 10. By way of example, an optical lens, for example, a collimation lens, may bear on the bearing section 340 of the molded body 300, which lens may be provided, for example, to collimate the laser beam 210 emitted by the laser chip 200 in the direction of the "fast axis" after emergence from the molded body 300. In this example, the bearing section 340 of the molded body 300 facilitates the alignment of said optical lens.

FIG. 4 shows a schematic sectional side view of a laser component 10 in accordance with a second example. The example of the laser component 10 as shown in FIG. 4 largely corresponds to the example of the laser component 10 as shown in FIG. 3. Corresponding component parts are provided with the same reference signs in FIGS. 3 and 4. The above description of the example of the laser component 10 as shown in FIG. 3, and of the method of producing the laser component, also applies, apart from the deviations described below, to the example of the laser component 10 as shown in FIG. 4.

In the example of the laser component 10 as shown in FIG. 4, the emergence section 330 of the surface 310 of the molded body 300 constitutes an optical lens 350. In the example illustrated, the optical lens 350 constitutes a collimation lens. However, the optical lens 350 might also be some other optical lens.

For the purpose of producing the molded body 300 of the laser component 10 shown in FIG. 4, the upper extension surface 445 of the upper extension 440 of the upper part 420 of the mold tool 400 comprises a shape that constitutes a negative of the shape of the emergence section 330 constituting the optical lens 350.

The emergence section 330 constituting the optical lens 350 shapes the laser beam 210 during the emergence of the laser beam 210 from the molded body 300 through the emergence section 330. By way of example, the optical lens 350 may collimate the laser beam 210 during emergence from the molded body 300. The emergence section 330 may additionally deflect the laser beam 210 during the emergence from the molded body 300, although this is not absolutely necessary.

Figure 5:
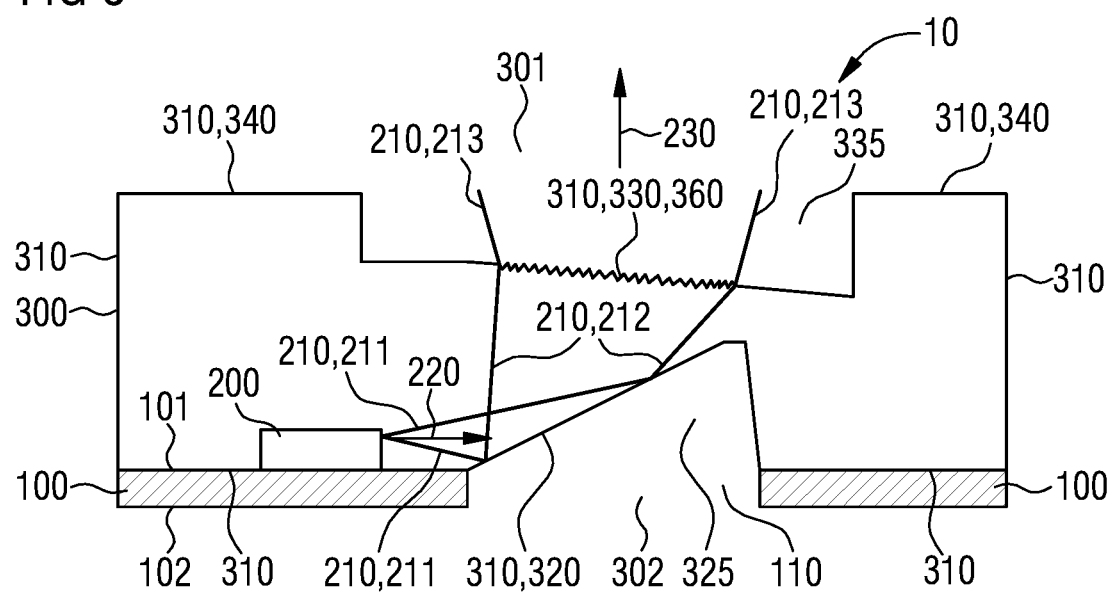

FIG. 5 shows a schematic sectional side view of a laser component 10 in accordance with a third example. The third example of the laser component 10 largely corresponds to the first example of the laser component 10 as shown in FIG. 3. Corresponding component parts are provided with the same reference signs in FIGS. 3 and 5. The above description of the laser component 10 and of the method of producing the latter correspondingly also applies to the example of the laser component 10 as shown in FIG. 5, insofar as deviations are not explicitly described below.

In the example of the laser component 10 as shown in FIG. 5, the emergence section 330 of the surface 310 of the molded body 300 comprises a roughening 360, which has been produced by a corresponding roughening of the upper extension surface 445 of the upper extension 440 of the upper part 420 of the mold tool 400. The roughening 360 acts as an optical diffusor to diffusely scatter the laser beam 210 emerging from the molded body 300. In addition, in the example of the laser component 10 as shown in FIG. 5, too, the emergence section 330 may bring about a deflection of the laser beam 210. However, this is not absolutely necessary.

Our components and methods have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims the priority of DE 10 2016 120 635.0, the subject matter of which is incorporated herein by reference.

The invention claimed is:

1. A laser component comprising:
   a molded body, and
   a laser chip embedded into the molded body and configured to emit a laser beam in an emission direction,
   wherein a surface of the molded body comprises a deflection section arranged and inclined relative to the emission direction such that a laser beam emitted by the laser chip impinges on the deflection section and is subjected to total internal reflection at the deflection section,
   the laser component comprises a carrier, the laser chip is arranged at a top side of the carrier, and the molded body adjoins the top side of the carrier, and
   the emission direction is oriented parallel to the top side of the carrier.

2. The laser component according to claim 1, wherein the deflection section is formed at a side of the molded body facing the top side of the carrier, and the carrier comprises an opening in a region of the deflection section.

3. The laser component according to claim 1, wherein the surface of the molded body comprises, at a side of the molded body facing away from the top side of the carrier, a bearing section parallel to the emission direction.

4. The laser component according to claim 1, wherein the surface of the molded body comprises an emergence section, and a laser beam emitted by the laser chip and reflected at the deflection section emerges from the molded body through the emergence section.

5. The laser component according to claim 4, wherein a laser beam emitted by the laser chip and reflected at the deflection section is refracted at the emergence section in a direction perpendicular to the emission direction.

6. The laser component according to claim 4, wherein the emergence section constitutes an optical lens or a collimation lens.

7. The laser component according to claim 4, wherein the emergence section comprises a roughening.

8. The laser component according to claim 3, wherein the surface of the molded body comprises an emergence section, a laser beam emitted by the laser chip and reflected at the deflection section emerges from the molded body through the emergence section, and the bearing section delimits the emergence section.

9. The laser component according to claim 1, wherein the molded body comprises a silicone.

10. A method of producing a laser component comprising:
    providing a laser chip configured to emit a laser beam in an emission direction; and
    forming a molded body,
    wherein the laser chip is embedded into the molded body, and the molded body is formed with a surface comprising a deflection section arranged and inclined relative to the emission direction such that a laser beam emitted by the laser chip impinges on the deflection section and is subjected to total internal reflection at the deflection section, and
    the molded body is formed by a molding method in a mold tool, transfer molding or compression molding, and the deflection section is formed at an extension of the mold tool.

11. The method according to claim 10, further comprising:
    providing a carrier; and
    arranging the laser chip at a top side of the carrier;
    wherein the molded body is formed in a manner adjoining the top side of the carrier.

12. The method according to claim 10, further comprising:
    providing a carrier; and
    arranging the laser chip at a top side of the carrier;
    wherein the molded body is formed in a manner adjoining the top side of the carrier, the carrier is provided with an opening, and the extension of the mold tool projects through the opening of the carrier during the process of forming the molded body.

* * * * *